(12) United States Patent
Qu et al.

(10) Patent No.: US 9,263,599 B2
(45) Date of Patent: Feb. 16, 2016

(54) SEMICONDUCTOR SYSTEM AND METHOD FOR MANUFACTURING SAME

(75) Inventors: Ning Qu, Reutlingen (DE); Alfred Goerlach, Kusterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 363 days.

(21) Appl. No.: 13/382,986

(22) PCT Filed: Jun. 9, 2010

(86) PCT No.: PCT/EP2010/058067
§ 371 (c)(1),
(2), (4) Date: Apr. 2, 2012

(87) PCT Pub. No.: WO2011/015394
PCT Pub. Date: Feb. 10, 2011

(65) Prior Publication Data
US 2012/0181652 A1    Jul. 19, 2012

(30) Foreign Application Priority Data
Aug. 5, 2009 (DE) .................. 10 2009 028 248 U

(51) Int. Cl.
| | |
|---|---|
| *H01L 21/20* | (2006.01) |
| *H01L 29/06* | (2006.01) |
| *H01L 29/872* | (2006.01) |
| *H01L 29/66* | (2006.01) |

(52) U.S. Cl.
CPC ........ *H01L 29/8725* (2013.01); *H01L 29/0623* (2013.01); *H01L 29/0626* (2013.01); *H01L 29/66143* (2013.01)

(58) Field of Classification Search
CPC .............................. H01L 21/20; H01L 29/872
USPC ............................ 257/471, 449, 453, 73, 260
See application file for complete search history.

(56) References Cited

U.S. PATENT DOCUMENTS

| | | | |
|---|---|---|---|
| 5,365,102 A | 11/1994 | Mehrotra et al. | |
| 6,078,090 A | 6/2000 | Williams et al. | |
| 7,964,930 B2 * | 6/2011 | Goerlach et al. | 257/471 |

(Continued)

FOREIGN PATENT DOCUMENTS

| | | |
|---|---|---|
| DE | 69428996 | 6/2002 |
| DE | 102004053760 | 5/2006 |
| TW | 200921792 A | 5/2009 |
| WO | WO 01/11693 | 2/2001 |
| WO | WO 01/52306 | 7/2001 |
| WO | WO 2006048354 A1 * | 5/2006 |

OTHER PUBLICATIONS

International Search Report, PCT International Application No. PCT/EP2010/058067, dated Aug. 20, 2010.

(Continued)

*Primary Examiner* — Evan Pert
(74) *Attorney, Agent, or Firm* — Kenyon & Kenyon LLP

(57) ABSTRACT

A semiconductor system having a trench MOS barrier Schottky diode is described, including an n-type epitaxial layer, in which at least two etched trenches are located in a two-dimensional manner of presentation on an $n^+$-type substrate which acts as the cathode zone. An electrically floating, p-type layer, which acts as the anode zone of the p-n type diode, is located in the n-type epitaxial layer, at least in a location below the trench bottom. An oxide layer is located between a metal layer and the surface of the trenches. The n-type epitaxial layer may include two n-type layers of different doping concentrations.

16 Claims, 2 Drawing Sheets

(56) References Cited

U.S. PATENT DOCUMENTS

| | | | |
|---|---|---|---|
| 2002/0066926 A1* | 6/2002 | Hshieh et al. | 257/330 |
| 2002/0125541 A1* | 9/2002 | Korec et al. | 257/471 |
| 2007/0145429 A1* | 6/2007 | Francis et al. | 257/260 |
| 2008/0315363 A1 | 12/2008 | Chiola et al. | |
| 2011/0212602 A1 | 9/2011 | Goerlach et al. | |

OTHER PUBLICATIONS

T. Sakai et al., "Experimental Investigation of Dependence of Electrical Characteristics of Device Parameters in Trench MOS Barrier Schottky Diodes," *Proceedings of 1998 International Symposium of Power Semiconductors & ICs*, Kyoto, pp. 293-296, (1992).

* cited by examiner

SEMICONDUCTOR SYSTEM AND METHOD FOR MANUFACTURING SAME

FIELD OF THE INVENTION

The present invention relates to a trench MOS barrier Schottky diode (TMBS) having floating p-type wells under the trench bottom as a clamping element, the diode being suitable, in particular, as a Zener diode having a breakdown voltage of approximately 20V for use in motor vehicle generator systems.

BACKGROUND INFORMATION

More and more functions in modern motor vehicles are being implemented using electrical components. This results in an ever higher demand for electrical power. To meet this demand, the efficiency of the generator system in the motor vehicle must be increased. Until now, p-n type diodes have ordinarily been used as Zener diodes in motor vehicle generator systems. The advantages of p-n type diodes are a low reverse current, on the one hand, and high robustness, on the other hand. The main disadvantage is a high forward voltage UF. At room temperature, current begins to flow only at UF=0.7V. Under normal operating conditions, e.g., a current density of 500 A/cm$^2$, UF increases to over 1V, which means a not inconsiderable loss in generator efficiency.

Theoretically, Schottky diodes are available as an alternative. Schottky diodes have a much lower forward voltage than p-n type diodes, for example 0.5V to 0.6V at a high current density of, for example, 500 A/cm$^2$. As majority carrier components, Schottky diodes also have advantages in rapid switching operation. However, Schottky diodes have not yet been used in motor vehicle generator systems. This circumstance is attributable to a number of important disadvantages of Schottky diodes: 1) higher reverse current compared to p-n type diodes; 2) great dependency of the reverse current on reverse voltage; and 3) poor robustness, in particular at high temperatures.

Ways to improve Schottky diodes have been proposed. One such method is the TMBS (Trench MOS barrier Schottky diode), see T. Sakai, et al., "Experimental Investigation of Dependence of Electrical Characteristics on Device Parameters in Trench MOS Barrier Schottky Diodes," Proceedings of 1998 International Symposium on Power Semiconductors & ICs, Kyoto, pp. 293-296, and German Patent No. DE 69428996 A1.

As shown in FIG. 1, the TMBS is made of an n$^+$-type substrate 1, an n-type epitaxial layer 2, at least two trenches 6 which are provided in n-type epitaxial layer 2 by etching, metal layers on the front of chip 4 as the anode electrode and on the back of chip 5 as the cathode electrode, and oxide layers 7 between trenches 6 and metal layer 4. From an electrical point of view, the TMBS is a combination of a MOS structure having a metal layer 4, oxide layers 7 and an n-type epitaxial layer 2 and a Schottky diode having Schottky barriers between metal layer 4 as the anode and n-type epitaxial layer 2 as the cathode. Currents flow in the forward direction through the mesa region between trenches 6. Trenches 6 themselves are not available for current flow. The effective area for current flow in the forward direction is therefore smaller in a TMBS than it is in a conventional planar Schottky diode.

The advantage of a TMBS lies in the reduction of reverse currents. In the reverse direction, space charge zones form in both the MOS structure and in the Schottky diode. The space charge zones expand as the voltage increases and converge in the middle of the region between adjacent trenches 6 at a voltage which is lower than the breakdown voltage of the TMBS. The Schottky effects responsible for high reverse currents are shielded thereby and the reverse currents reduced. This shielding effect is greatly dependent on the structural parameters of trench depth Dt, distance between trenches Wm, trench width Wt as well as on the thickness of oxide layer To (see FIG. 1).

Conventionally, the TMBS is manufactured by: providing trenches 6 by etching n-type epitaxial layer 2, growing oxide layer 7 and filling the trenches with conductive, doped layers made of polysilicon. Alternatively, the trenches may be filled with metal. The expansion of the space charge zones in the mesa region between trenches 6 is quasi one-dimensional, provided that trench depth Dt is much greater than distance between trenches Wm.

However, a disadvantage of the TMBS lies in the weakness of the MOS structure. At breakdown, very high electrical fields form within oxide layer 7 and in the direct vicinity of the oxide layer in n-type epitaxial layer 2. As a result, the MOS structure may become degraded due to the injection of "hot" charge carriers from n-type epitaxial layer 2 into oxide layer 7 and even be destroyed under certain operating conditions. Another disadvantage of the TMBS is its round or soft reverse characteristic. This means that, far before the actual breakdown, e.g., at a voltage=70% to 80% of the breakdown voltage, the reverse current already begins to rise substantially and is significantly higher than the reverse current at a lower voltage. This high reverse current in advance of the Schottky diode breakdown, may result in a high power loss, in particular at high temperatures, and also in thermal instability (thermal runaway) and failure of the component, due to positive, electrical/thermal feedback.

SUMMARY

An object of the present invention is to provide Schottky diodes having a high robustness and lower forward voltage which are suitable as Zener power diodes for use in motor vehicle generator systems. An integrated series connection of p-n protection diodes having Schottky diodes thus makes it possible to also reliably operate Schottky diodes at voltage breakdown. This mode of operation is necessary, among other things, for load dump protection when used in motor vehicle generators.

The example Schottky diode according to the present invention is a TMBS having floating p-type wells under the trench bottom. The p-n type diode, which includes the floating p-type wells and the n-type epitaxial layer, determines the breakdown voltage of the TMBS according to the present invention and functions as a clamping element. The design of the p-type wells is selected in such a way that the breakdown voltage of p-n type diode BV_pn is lower than the breakdown voltage of Schottky diode BV_schottky and the breakdown voltage of MOS structure BV_mos, and the TMBS according to the present invention has an angular forward characteristic. At breakdown, the electrical field strength in the oxide layer is much lower than the electrical field strength in a conventional TMBS.

Compared to a conventional TMBS, the example embodiment of the present invention has high robustness and stability due to the clamping function of the integrated p-n type diode and therefore suitability as a Zener diode for use in motor vehicle generator systems, since a lower field strength is present at the oxide layer. The system according to the present invention may represent a standard process, due to a modified trench power MOSFET.

DETAILED DESCRIPTION OF EXAMPLE EMBODIMENTS

Figure 1:
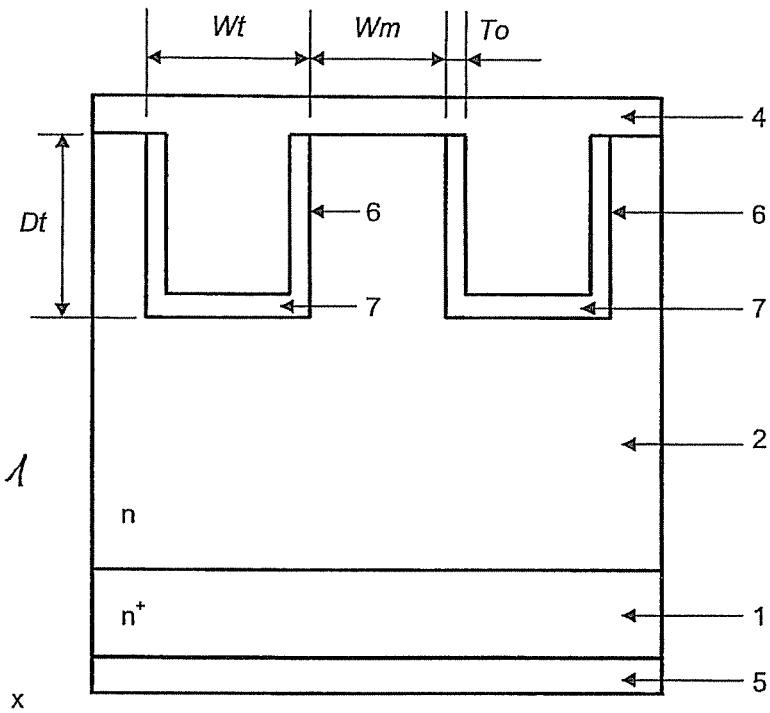
FIG. 1 shows a TMBS (trench MOS barrier Schottky) diode.
Figure 2:
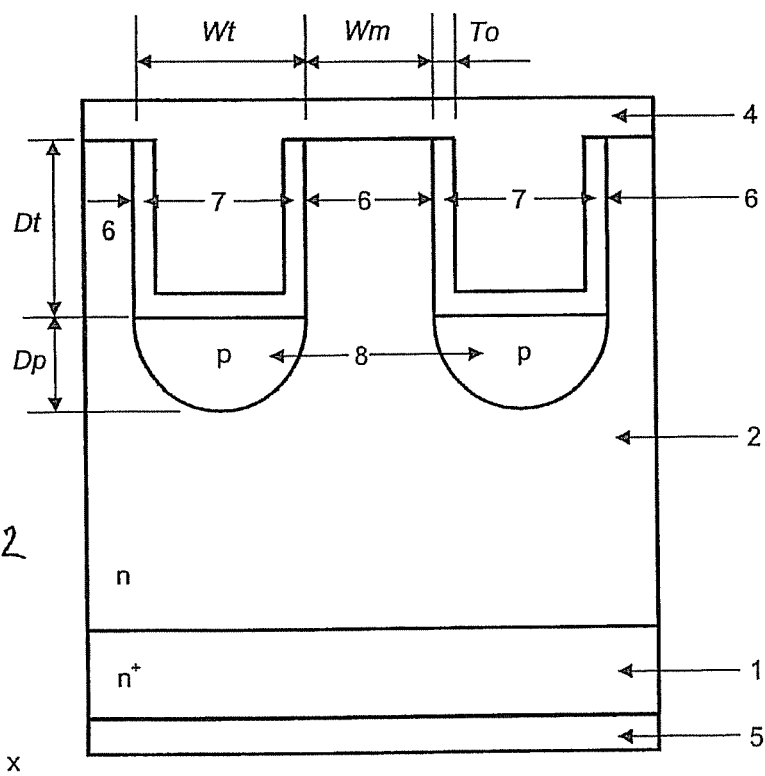
FIG. 2 shows a TMBS having floating p-type wells under the trench bottom according to the present invention.

As shown in FIG. 2, the TMBS having floating p-type wells below the trench bottom according to the present invention includes an $n^+$-type substrate 1, an n-type epitaxial layer 2, at least two trenches 6 etched into n-type epitaxial layer 2 which have a width Wt, a depth Dt and a distance between adjacent trenches 6 Wm, metal layers on the front of chip 4 as the anode electrode and on the back of chip 5 as the cathode electrode, and oxide layers 7 having a thickness To on the surface of trenches 6. Electrically floating p-type wells 8, which have a thickness Dp and form p-n junctions together with n-type epitaxial layer 2, are located under the trench bottom.

From an electrical point of view, the TMBS having floating p-type wells under the trench bottom according to the present invention is a combination of a MOS structure having metal layer 4 in combination with oxide layer 7 and n-type epitaxial layer 2, a Schottky diode having Schottky barriers between metal layer 4 as the anode and n-type epitaxial layer 2 as the cathode and a p-n type diode having a p-n junction between floating p-type wells 8 as the anode and n-type epitaxial layer 2 as the cathode. Floating wells 8 are designed in such a way that the breakdown voltage of the TMBS according to the present invention is determined by the breakdown voltage of the p-n junction between p-type wells 8 and n-type epitaxial layer 2.

In the TMBS having floating p-type wells under the trench bottom according to the present invention, currents in the forward direction flow only through the Schottky diode, as in a conventional TMBS, if the forward voltage of the Schottky diode is much lower than the forward voltage of the p-n type diode. In the reverse direction, space charge zones form in the MOS structure, the Schottky diode and the p-n type diode. The space charge zones expand in both epitaxial layer 2 and p-type wells 8 as the voltage increases and converge in the middle of the region between adjacent trenches 6 at a voltage which is lower than the breakdown voltage of the TMBS according to the present invention. The Schottky effects (barrier lowering) responsible for high reverse currents are shielded thereby and the reverse currents reduced. This shielding effect is determined by the MOS structure and the p-type wells and is greatly dependent on the structural parameters of trench depth Dt, distance between the trenches, trench width Wt, thickness of oxide layer To as well as thickness of p-type well Dp. In breakdown mode, reverse currents flow through the floating p-type wells and then through the inversion layer of the MOS structure to the Schottky contact, i.e., the p-n type diode and the Schottky diode are connected in series. The TMBS according to the present invention has a shielding action of Schottky effects which is similar to that of a conventional TMBS, but it also has a high robustness, due to the integrated clamping function. The breakdown voltage of p-n type diode BV_pn is designed in such a way that BV_pn is lower than the breakdown voltage of Schottky diode BV_schottky and the breakdown voltage of MOS structure BV_mos, and the breakdown occurs at the p-n junction between p-type wells 8 and n-type epitaxial layer 2 and at the bottom of the p-type wells. The high electrical field strength at breakdown on the bottom of the p-type wells and the electrical field strength in the vicinity of the MOS structure are therefore much lower than in a conventional TMBS. This is extremely advantageous to avoid component instability due to the injection of "hot" charge carriers into oxide layer 7. A drift in breakdown voltage may thus be avoided. A TMBS having floating p-type wells under the trench bottom according to the present invention is therefore highly suitable as a Zener power diode for use in motor vehicle generator systems.

If the breakdown voltage of p-n type diode BV_pn is substantially lower than the breakdown voltage of Schottky diode BV_schottky, e.g., BV_pn=50% of BV_schottky, the TMBS according to the present invention will have an angular reverse characteristic, i.e., the so-called "pre-breakdown" of the Schottky diode of a conventional TMBS no longer takes place. This increases the robustness of the component.

Figure 3:
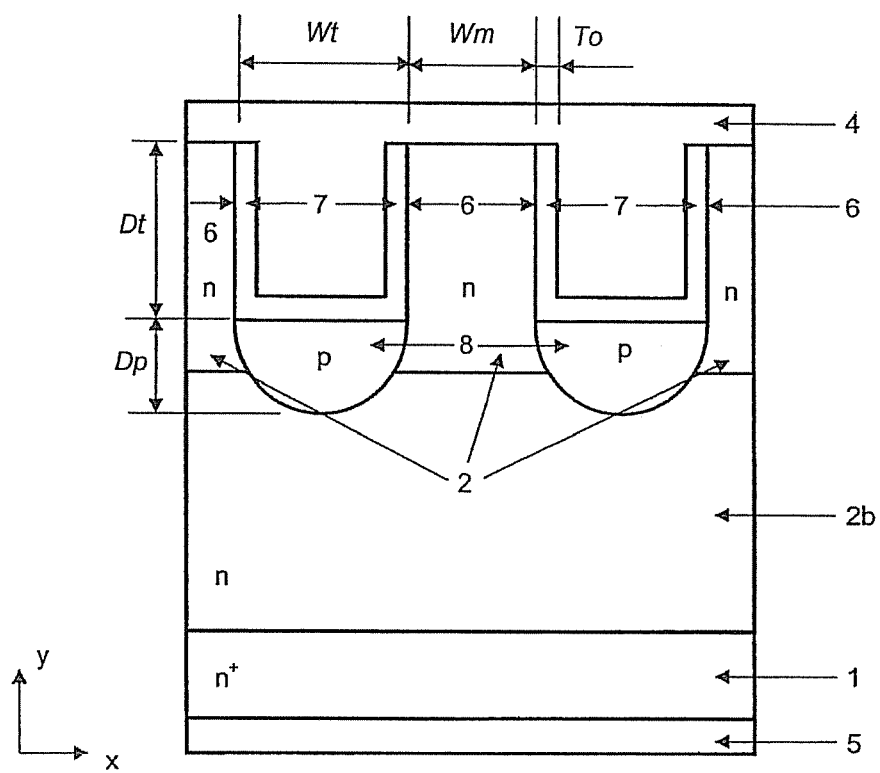
FIG. 3 shows a TMBS having floating p-type wells under the trench bottom, having a stepped epitaxial layer according to the present invention.

An angular reverse characteristic may be implemented even more easily with the aid of a stepped epitaxial layer. As shown in FIG. 3, unlike the variant in FIG. 2, the n-type epitaxial layer is no longer provided with a uniform doping concentration but rather divided from top to bottom into two areas of different doping concentrations. Upper n-type epitaxial layer 2 permits the higher breakdown voltage of Schottky diode BV_schottky and is low-doped. Lower n-type epitaxial layer 2b, into which the lower region of the p-type wells is diffused, has a higher doping concentration. The p-n junction between the floating p-type wells and the lower n-type epitaxial layer therefore has a lower breakdown voltage and thus determines the breakdown voltage of the p-n type diode and, as a result, the breakdown voltage of the TMBS according to the present invention.

In the TMBS according to the present invention, additional structures may be provided in the edge area of the chip for reducing the marginal field intensity. These structures may be, for example, low-doped p-type regions, magnetoresistors or similar conventional structures. It is also possible for the semiconductor layers or all semiconductor layers to include the opposite type of conductivity and for the anode and cathode connections to be transposed.

A first example method for manufacturing a TMBS having floating p-type wells according to the present invention includes the following steps:
  $n^+$-type substrate as the source material;
  epitaxy;
  trench etching;
  oxidizing the surface of trenches;
  etching the oxide layer at the trench bonds;
  diffusing the p-type well through the trench bottom;
  etching the oxide layer on the side walls and bottom of the trenches;
  oxidizing the surface of trenches;
  filling the trenches with doped polysilicon;
  metallization on the front and back.

A second example method for manufacturing a TMBS having floating p-type wells according to the present invention includes the following steps:
  $n^+$-type substrate as the source material;
  epitaxy;
  trench etching;

filling the trenches with p-doped Si or poly-Si up to a thickness Dp (see FIGS. 2 and 3);
if necessary, etching part of the p-doped Si or poly-Si in trenches;
oxidizing the surface of trenches;
filling the trenches with doped polysilicon;
metallization on the front and back.

What is claimed is:

1. A semiconductor system, comprising:
a trench MOS barrier Schottky diode made of an n-type epitaxial layer and a metal layer to form a Schottky diode, wherein in the n-type epitaxial layer, in a two-dimensional representation, at least two etched trenches are located on an n+-type substrate that acts as a cathode zone;
an electrically floating p-doped well that acts as an anode zone of a p-n type diode and is located in the n-type epitaxial layer, at least in one location below a bottom of at least one of the trenches; and
an oxide layer located between the metal layer and a surface of the trenches, wherein the n-doped epitaxial layer includes two different highly doped n-type layers, one upper epitaxial layer, which is a highly doped n+-type layer, and a lower epitaxial partial layer adjoining the upper epitaxial layer, which has a higher doping concentration than the upper epitaxial layer; and wherein a lower region of the p-doped well is diffused into the lower epitaxial partial layer, wherein an upper region of each p-doped well is located in the upper epitaxial layer.

2. The semiconductor system as recited in claim 1, wherein a breakdown voltage of a p-n type diode formed from the floating p-doped well and the n-type epitaxial layer is lower than a breakdown voltage of the Schottky diode formed from the metal layer as an anode and the n-type epitaxial layer as the cathode, and a breakdown voltage of a MOS structure formed from the metal layer, the oxide layer and the n-type epitaxial layer.

3. The semiconductor system as recited in claim 2, wherein the breakdown voltage of the p-n type diode is in an area of 50% of the breakdown voltage of the Schottky diode.

4. The semiconductor system as recited in claim 2, wherein the p-doped wells and the n-type epitaxial layer are designed in such a way that a breakdown voltage of the TMBS is determined by the p-n type diode, and the breakdown occurs at the bottom of the p-doped wells.

5. The semiconductor system as recited in claim 1, wherein the semiconductor system is operable at high currents during breakdown.

6. The semiconductor system as recited in claim 1, wherein the semiconductor system has a breakdown voltage in a range of 20V to 40V.

7. The semiconductor system as recited in claim 1, wherein the semiconductor system is one of a rectifier and a load dump protection diode in a motor vehicle generator.

8. The semiconductor system as recited in claim 1, wherein a second metal layer is located on the back of a chip and acts as a cathode electrode, and the metal layer is located on a front of the chip and has a Schottky contact to the n-type epitaxial layer and acts as an anode electrode.

9. The semiconductor system as recited in claim 1, wherein the trenches have one of a rectangular shape, a U shape, or a predefinable shape.

10. The semiconductor system as recited in claim 1, wherein the trenches are situated in one of a strip configuration or as islands, the islands having one of a circular design or hexagonal design.

11. The semiconductor system as recited in claim 8, wherein the metal layer fills the trenches on a front of the chip.

12. The semiconductor system as recited in claim 4, wherein the floating p-doped wells are provided with one of p-doped Si or poly-Si by p-type diffusion through one of the bottom of the trench or by filling a lower region of the trenches.

13. The semiconductor system as recited in claim 1, wherein the trenches are produced by etching the n-type epitaxial layer.

14. The semiconductor system as recited in claim 1, wherein the n-type epitaxial layer and the p-doped wells are of opposite type of conductivity in each case, and anode and cathode connections are transposed.

15. A method for manufacturing a semiconductor system, comprising:
using an $n^+$-type substrate as a source material;
forming an n-doped epitaxial layer;
trench etching;
oxidizing surfaces of trenches formed by the trench etching;
etching an oxide layer formed by the oxidizing at trench bonds;
diffusing a p-doped well through a trench bottom;
etching the oxide layer on side walls and bottom of the trenches;
oxidizing the surfaces of the trenches;
filling the trenches with doped polysilicon; and
metallizing on a front and back of the semiconductor system, wherein the n-doped epitaxial layer includes two different highly doped n-type layers, one upper epitaxial layer, which is a highly doped n+-type layer, and a lower epitaxial partial layer adjoining the upper epitaxial layer, which has a higher doping concentration than the upper epitaxial layer; and wherein a lower region of the p-well is diffused into the lower epitaxial partial layer, wherein an upper region of the p-well is located in the upper epitaxial layer.

16. A method for manufacturing a semiconductor system, comprising:
using $n^+$-type substrate as a source material;
forming an n-doped epitaxial layer;
trench etching;
filling trenches formed by the trench etching with one of p-doped Si or poly-Si up to a thickness;
etching part of the one of p-doped Si or poly-Si in the trenches;
oxidizing surface of the trenches;
filling the trenches with doped polysilicon; and
metallizing on a front and back of the semiconductor system, wherein the n-doped epitaxial layer includes two different highly doped n-type layers, one upper epitaxial layer, which is a highly doped n+-type layer, and a lower epitaxial partial layer adjoining the upper epitaxial layer, which has a higher doping concentration than the upper epitaxial layer; and wherein a lower region of a p-well in a trench bottom is diffused into the lower epitaxial partial layer, wherein an upper region of the p-well is located in the upper epitaxial layer.

* * * * *